(12) United States Patent
Taylor et al.

(10) Patent No.: US 8,081,500 B2
(45) Date of Patent: Dec. 20, 2011

(54) METHOD FOR MITIGATING IMPRINT IN A FERROELECTRIC MEMORY

(75) Inventors: Craig Taylor, Colorado Springs, CO (US); Fan Chu, Colorado Springs, CO (US); Shan Sun, Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 150 days.

(21) Appl. No.: 12/415,918

(22) Filed: Mar. 31, 2009

(65) Prior Publication Data

US 2010/0246238 A1   Sep. 30, 2010

(51) Int. Cl.
G11C 11/22 (2006.01)
(52) U.S. Cl. .................. 365/145; 365/49.12; 365/49.13; 365/65; 365/102; 365/117; 365/149; 365/230.06
(58) Field of Classification Search .................. 365/145, 365/49.12, 49.13, 65, 102, 117, 149, 230.06
See application file for complete search history.

(56) References Cited

U.S. PATENT DOCUMENTS

| | | | |
|---|---|---|---|
| 5,525,528 A | 6/1996 | Perino et al. | |
| 5,661,730 A | 8/1997 | Mitra et al. | |
| 5,745,403 A | 4/1998 | Taylor | |
| 5,777,921 A | 7/1998 | Takata et al. | |
| 5,912,846 A * | 6/1999 | Taylor | 365/189.05 |
| 6,008,659 A | 12/1999 | Traynor | |
| 6,459,609 B1 | 10/2002 | Du | |
| 6,590,798 B1 | 7/2003 | Komatsuzaki | |
| 6,650,158 B2 | 11/2003 | Eliason | |
| 6,894,549 B2 | 5/2005 | Eliason | |
| 7,116,572 B2 | 10/2006 | Sun et al. | |
| 7,176,824 B2 | 2/2007 | Du et al. | |
| 7,271,744 B2 | 9/2007 | Du et al. | |
| 7,313,010 B2 | 12/2007 | Sun et al. | |
| 2006/0098470 A1 | 5/2006 | Sun et al. | |
| 2008/0180984 A1 * | 7/2008 | Takashima et al. | 365/145 |
| 2009/0089489 A1 * | 4/2009 | Mukaida et al. | 711/103 |
| 2009/0231903 A1 * | 9/2009 | Ogiwara et al. | 365/145 |

OTHER PUBLICATIONS

European Search Report, Application No. 10157634.6-1233/2237280, mailed Oct. 20, 2010, 7 pages.

* cited by examiner

*Primary Examiner* — Fernando Hidalgo
(74) *Attorney, Agent, or Firm* — William J. Kubida; Peter J. Meza; Hogan Lovells US LLP

(57) ABSTRACT

An array of ferroelectric memory cells that allows imprint mitigation includes ferroelectric memory cells respectively coupled to word lines, plate lines, and bit lines; a word line driver for driving the word lines; a plate line driver for driving the plate lines; a bit line driver for driving the bit lines; and an isolation device driver for driving isolation devices coupled between the bit lines and a plurality of bit lines. The method for mitigating imprint includes coupling the bit lines to a respective plurality of sense amplifiers, turning on a word line and pulsing a plate line associated with a row of ferroelectric memory cells, disconnecting the bit lines from the respective sense amplifiers, driving the plate line low and the bit lines high, driving the plate line high and the bit lines low, driving the plate line low and floating the bit lines, driving the bit lines with the sense amplifier, and turning off the word line and precharging the bit lines. The method can be performed after each memory access, or can be performed whenever convenient with a counter and a rejuvenate command.

7 Claims, 9 Drawing Sheets

| NAME | DESCRIPTION | OP-CODE |
|---|---|---|
| REJUV | REJUVENATE ROW | 0001 0111b |
| WREN | SET WRITE ENABLE LATCH | 0000 0110b |
| WRDI | WRITE DISABLE | 0000 0100b |
| RDSR | READ STATUS REGISTER | 0000 0101b |
| WRSR | WRITE STATUS REGISTER | 0000 0001b |
| READ | READ MEMORY DATA | 0000 0011b |
| WRITE | WRITE MEMORY DATA | 0000 0010b |
| SLEEP | ENTER SLEEP MODE | 1011 1001b |
| RDID | READ DEVICE ID | 1001 1111b |

Fig. 8

STATUS REGISTER

| BIT | 7 | 6 | 5 | 4 | 3 | 2 | 1 | 0 |
|---|---|---|---|---|---|---|---|---|
| NAME | WPEN | 0 | 0 | 0 | BP1 | BP0 | WEL | /READY |

METHOD FOR MITIGATING IMPRINT IN A FERROELECTRIC MEMORY

FIELD OF THE INVENTION

The present invention relates to ferroelectric memories, and more particularly, to improving performance through the rejuvenation of switched charge in the ferroelectric memory cell capacitors in a ferroelectric memory array.

BACKGROUND OF THE INVENTION

Retention for non-volatile memories that can be written to, such as ferroelectric memories, can fail in one of two ways. The first failure mode is that the data written to the memory is not retained when the power is removed (same state). The second failure mode is when a memory cell has a state that becomes preferred and intended data is not retained Ferroelectric memory cells can develop a preferred state, which is generally referred to as "imprint". The result of imprint is a reduction in switch charge at the operating voltage of the memory cell. If a cell is severely imprinted there may not be sufficient charge to change the polarization meaning that an attempt to write data to the opposite state has no effect. Referring now to FIG. 1, the effect of baking time on opposite state switch charge 102 can be seen. In general, opposite state switch charge 102 decreases linearly with respect to every factor of ten increase in baking time. Referring now to FIG. 2, it can be seen that if the polarization of the imprinted ferroelectric capacitor is switched multiple times, opposite state switch charge 202 can be recovered. FIG. 2 shows that the recovery of switch charge 202 (rejuvenation) is a function of the number of switched polarization cycles.

What is desired, therefore, is a ferroelectric memory architecture and associated method of operation with improved performance that mitigates imprint by maximizing available switch charge.

SUMMARY OF THE INVENTION

According to an embodiment of the present invention, an array of ferroelectric memory cells that allows imprint mitigation includes a plurality of ferroelectric memory cells respectively coupled to a plurality of word lines, plate lines, and bit lines; a word line driver for driving the word lines; a plate line driver for driving the plate lines; a bit line driver for driving the bit lines; and an isolation device driver for driving a plurality of isolation devices coupled between the bit lines and a plurality of bit lines. The method for mitigating imprint includes coupling the bit lines to a respective plurality of sense amplifiers by turning on the isolation device, turning on a word line and pulsing a plate line associated with a row of ferroelectric memory cells, disconnecting the bit lines from the respective sense amplifiers by turning off the isolation device, driving the plate line low and the bit lines high, driving the plate line high and the bit lines low, driving the plate line low and floating the bit lines, driving the bit lines with the sense amplifier by turning on the isolation device, and turning off the word line and precharging the bit lines. The method can be performed after each memory access, or, alternatively, can be performed whenever convenient with a separate rejuvenate command. A non-volatile counter can be used in conjunction with the rejuvenate command to keep track of the next row in need of rejuvenation.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 8 is a command table associated with the ferroelectric memory of FIG. 7 according to the present invention;

FIG. 9 is a status register associated with the ferroelectric memory of FIG. 7 according to the present invention.

DETAILED DESCRIPTION

Figure 1:
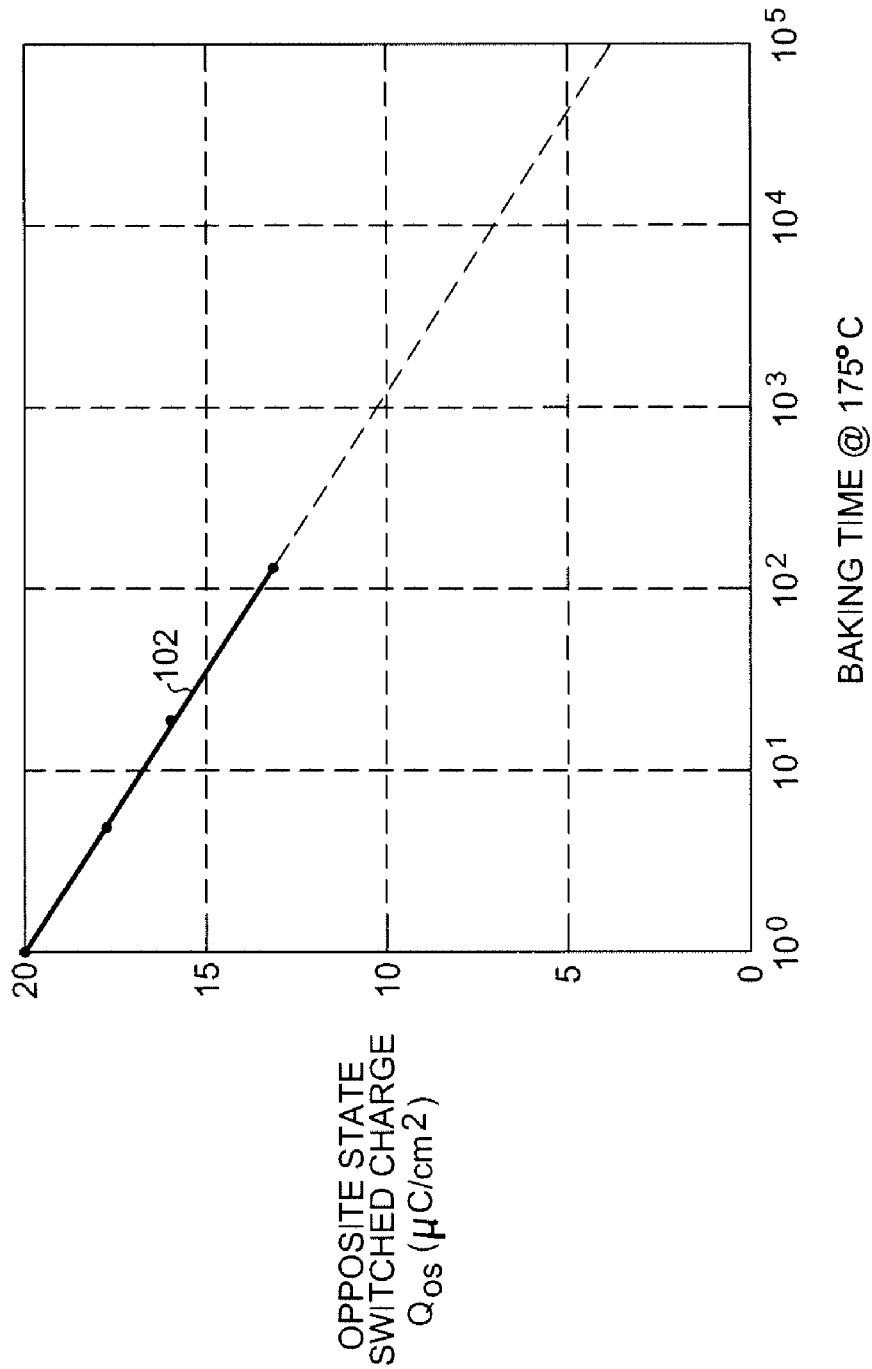
FIG. 1 is a plot of opposite state switch charge versus baking time according to the prior art.
Figure 2:
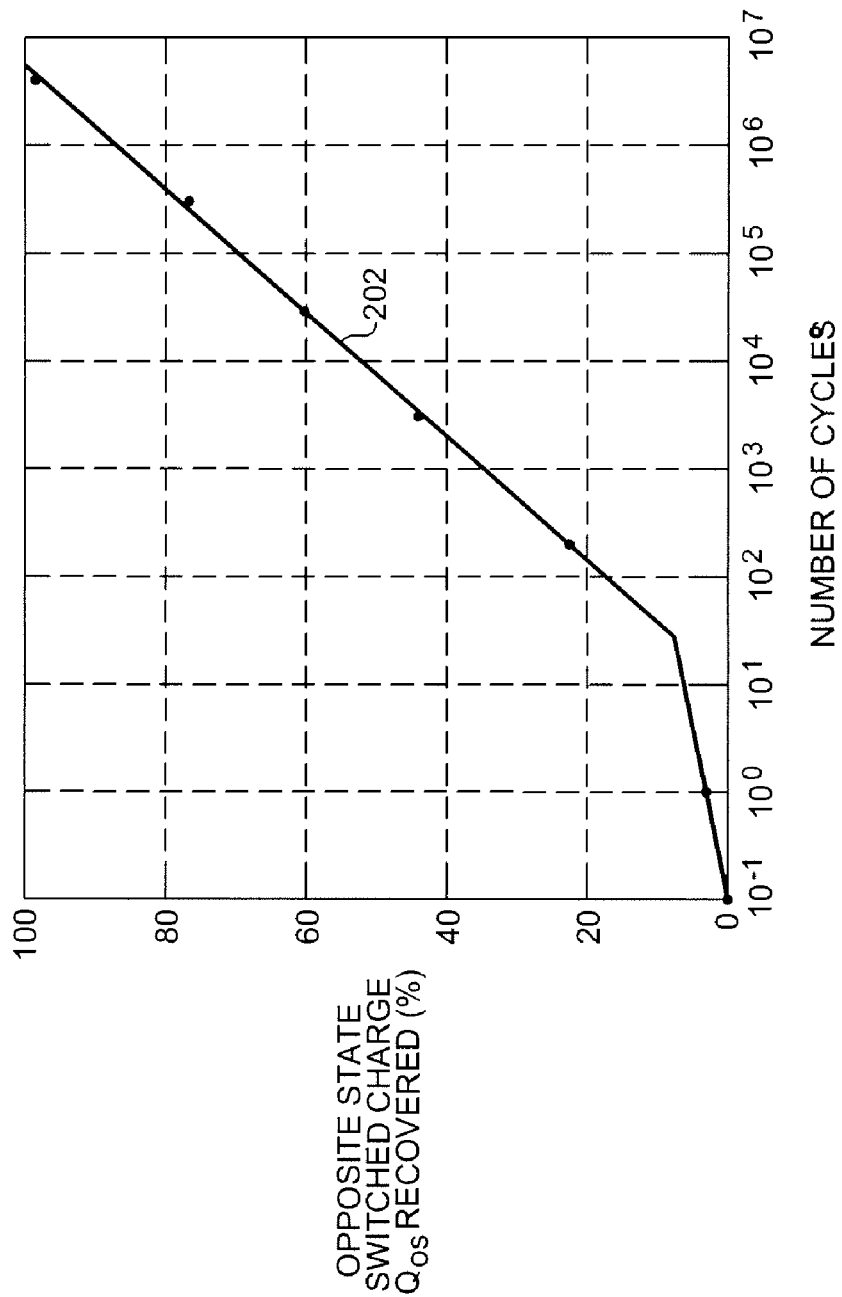
FIG. 2 is a plot of recovered opposite state switch charge versus switched polarization cycles according to the prior art.
Figure 3:
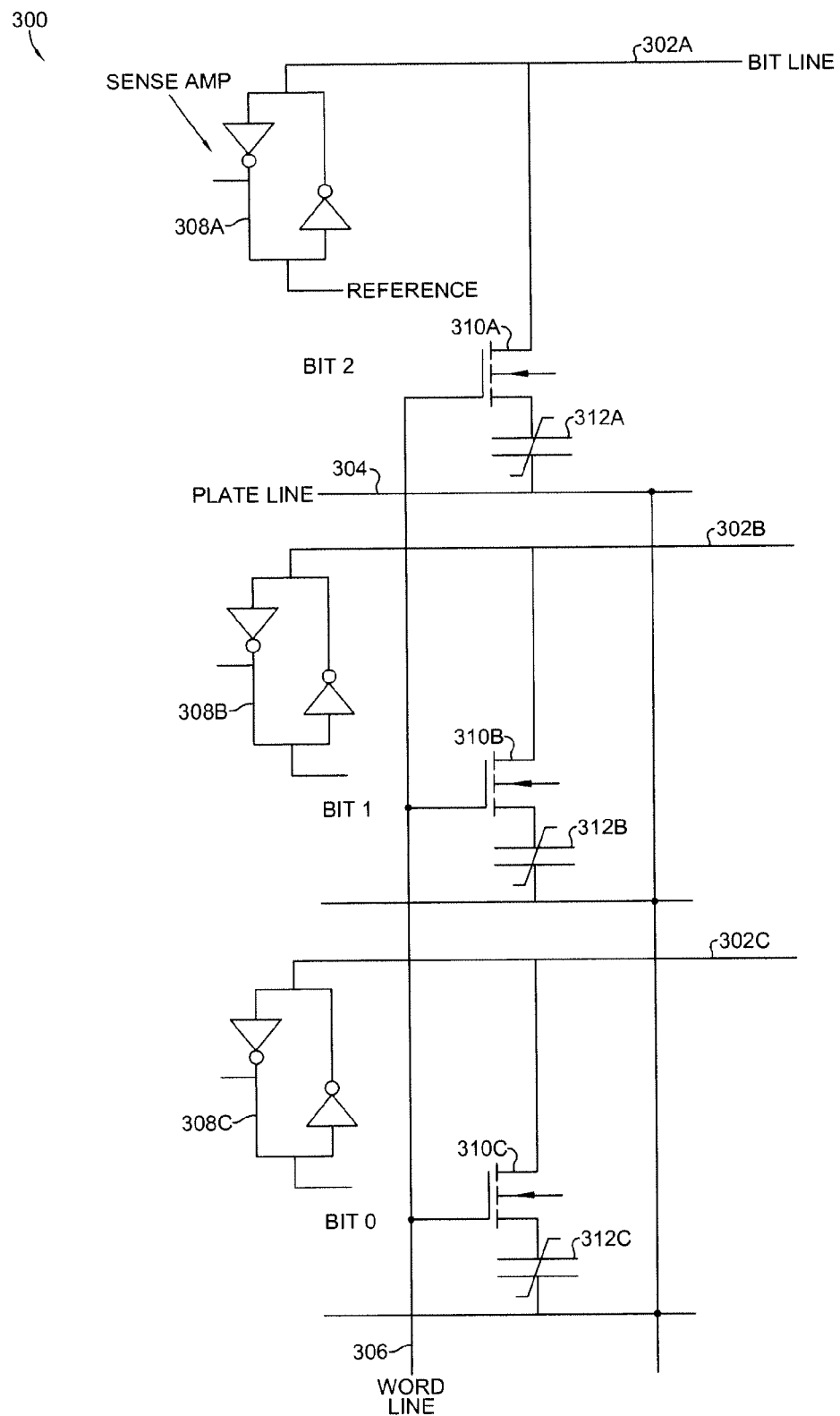
FIG. 3 is a schematic diagram of a portion of a ferroelectric memory according to the prior art.

Referring now to FIG. 3, a portion of a typical ferroelectric memory array 300 is shown. It will be appreciated by those skilled in the art that although only three bits in a row of 1T/1C memory cells is shown, an actual ferroelectric memory array is much larger and includes rows and columns of memory cells. Memory array 300 includes bit lines 302A, 302B, and 302C; shared plate line 304; and shared word line 306. Sense amplifiers 308A, 308B, and 308C are respectively coupled to bit lines 302A, 302B, and 302C. Each sense amplifier receives a reference voltage as is known in the art. A first memory cell includes access transistor 310A and ferroelectric capacitor 312A coupled between bit line 302A and plate line 304. A second memory cell includes access transistor 310B and ferroelectric capacitor 312B coupled between bit line 302B and plate line 304. A third memory cell includes access transistor 310C and ferroelectric capacitor 312C coupled between bit line 302C and plate line 304. The gate of the access transistors in the memory cells is coupled to word line 306. While a portion of a 1T/1C ferroelectric memory cell array is shown, a 2T/2C memory cell array could be used. This is because "Bit" is one side of the sense amp and "Bit Not" is the other (reference in a 1T/1C cell). The polarization on Bit is the opposite of Bit Not, so if the same method on both bit lines is used it has the same effect.

In operation, as typically implemented, word line 306 is turned on and plate line 304 is pulsed. This causes a field to be applied across each of the ferroelectric capacitors 312A, 312B, and 312C. The capacitors that have a polarization opposite to that of the applied field will switch, and conversely, those polarized in the same direction of the field will not switch. An inherent property of the ferroelectric capacitors is that the switched capacitance of a ferroelectric capacitor is much larger than the unswitched capacitance of a ferroelectric capacitor. Therefore, the voltage on the bit line will be higher if the polarization changes (switched) than if it does not (unswitched). The reference voltage is typically set to a voltage that is less than the bit line voltage would be in the switched case and greater than the bit line voltage would be in the unswitched case. The sense amplifiers 308 drive the respective bit line 302 to the respective ground or power supply rail. Once the bit line voltage is settled, the entire row of data is available at the output of the respective sense amplifiers. The data in the sense amplifiers is a reflection of what the data was in the array of memory cells. The polarization of the ferroelectric capacitors is in the same direction until plate line 304 goes back low, at which point the data is restored. The final step of a memory read cycle is to precharge bit lines 302 to zero volts.

Figure 4:
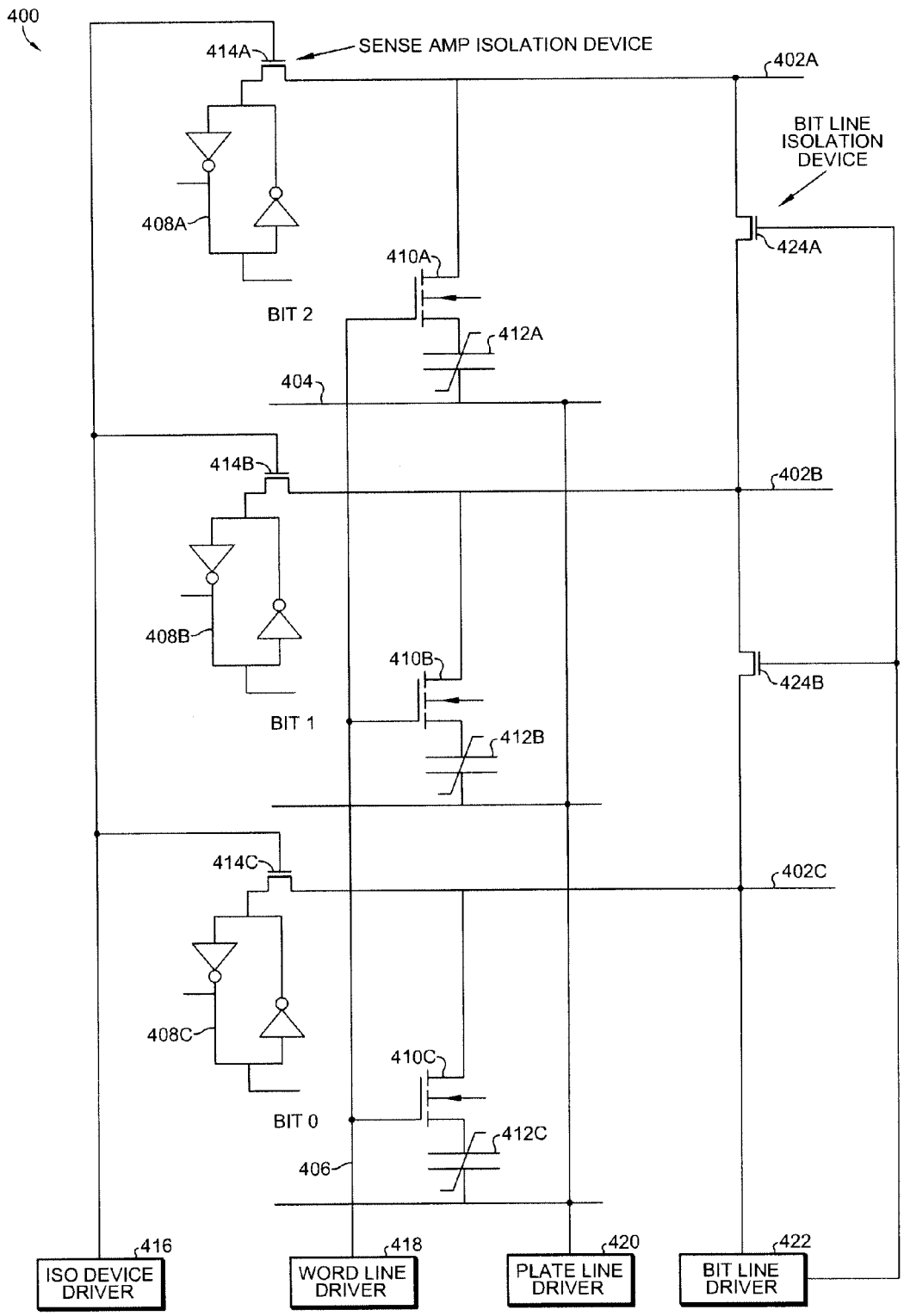
FIG. 4 is a schematic diagram of a portion of a ferroelectric memory according to the present invention.

Referring now to FIG. 4, a portion of a memory array 400 is shown, substantially as previously shown in FIG. 3, but with the addition of isolation devices 414A, 414B, and 414C coupled between isolation device driver 416 and bit line 402. Also included are bit line isolation devices 424A and 424B. The isolation devices make it possible to change and restore polarization of every cell in a row of memory. The arrows shown in FIG. 4 represent the polarization from the previous writing of data. FIG. 4 also shows word line driver 418, plate line driver 420, and bit line driver 422. The Isolation Device Driver 416 is of special note because it is not used in the prior art. Voltage has to be applied opposite the plate line voltage to switch the polarization in accordance with FIG. 5. There is a bit line driver already to drive the bit lines low (precharge). The bit line driver needs to be modified to drive high as well. Bit line 402, plate line 404, and word line 406 are substantially as shown in FIG. 3. Sense amplifiers 408, access transistors 410, and ferroelectric capacitors 412 are also substantially similar to those shown in FIG. 3.

Figure 5:
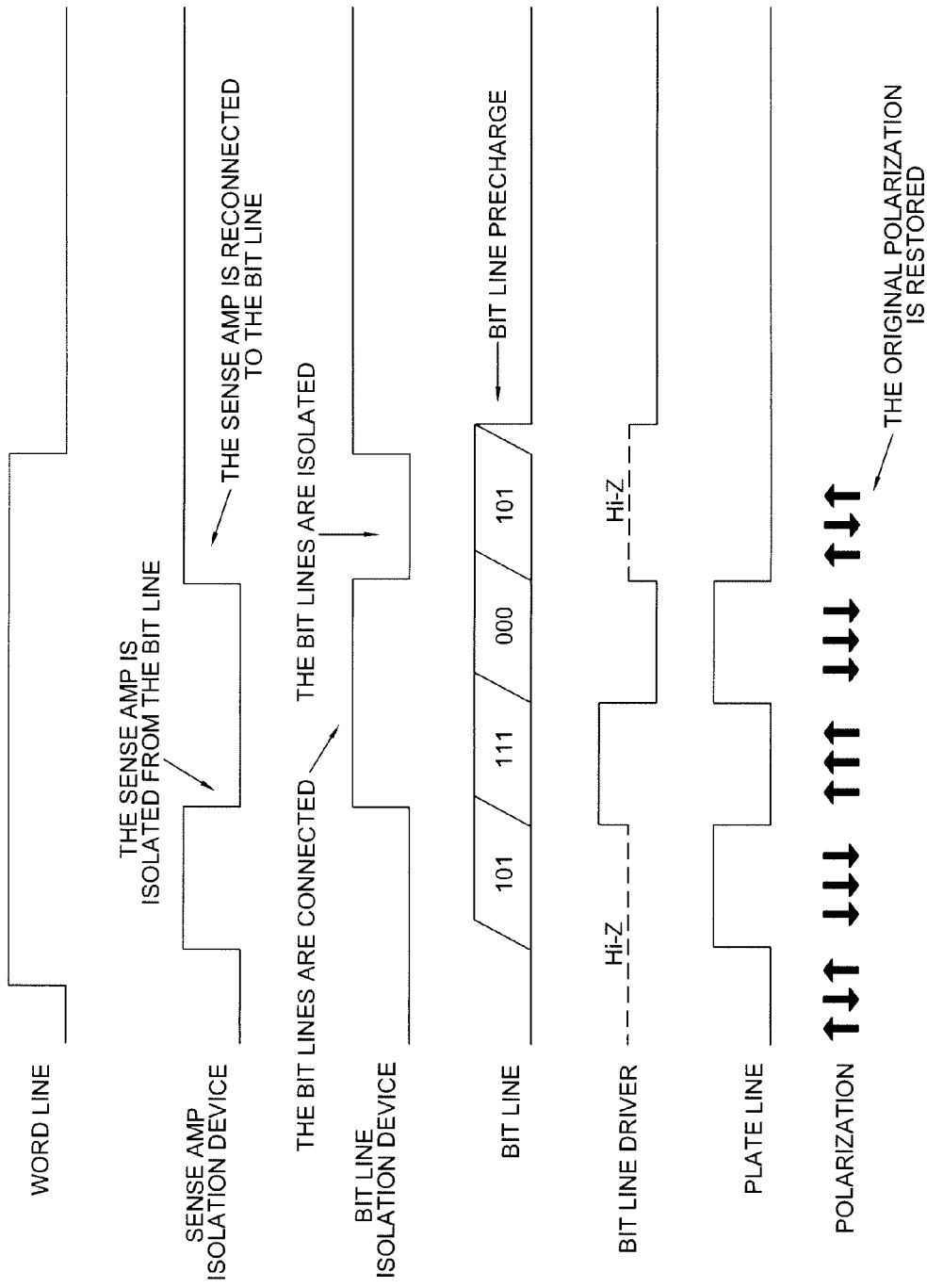
FIG. 5 is a timing diagram associated with the ferroelectric memory of FIG. 4 according to the present invention.

Referring now to FIG. 5, a timing diagram shows the relative timing for the process used to flip the polarization of each bit at least one cycle and restore the original state. The sequence of events shown in FIG. 5 is as follows:
1. Turn on the Isolation Device. This connects the Bit Line to the Sense Amplifier.
2. Turn on the Word Line and pulse the Plate Line. This causes the ferroelectric capacitor in Bit 1 to switch. The Sense Amplifier drives the respective Bit Lines to the rail voltage ground or Vdd. The voltage on the bit line will be higher than the reference for a switched bit and lower for an unswitched bit.
3. Turn off the Isolation Device, which disconnects the Bit Lines from the Sense Amplifiers. (The proposed Bit line driver in FIG. 4 is a tri-state bit line driver. It can drive high, low or is Hi-Z. Prior art bit line drivers typically drive low or Hi-Z.) The data in the ferroelectric memory cell is latched into the respective Sense Amplifier.
4. Drive the Plate Line low and the Bit Line high. This causes the polarization in all of the ferroelectric memory cells to flip. The Word line driver, Plate line driver and Bit line driver are common to a Row of memory, typically 64 bits.
5. Drive the Plate Line high and the Bit Line low. This causes the polarization in all of the ferroelectric memory cells to flip in the other direction.
6. Drive the Plate Line low and float the Bit Line driver. The Bit line driver is Hi-Z when the isolation device is turned on so the Bit line is either Vdd or Gnd (driven by the sense amp).
7. Turn on the Isolation Device. The Sense Amplifier drives the Bit Lines to the rails and the data is restored.
8. Turn off the Word Line and Precharge the Bit Line.

The method of the present invention can be implemented in several ways. The simplest is to perform the rejuvenation cycles after the access. This will have a performance impact because the cycle time will necessarily increase.

An alternative method is to have a rejuvenate command (for serial memories) or pin command (for parallel memories). This allows users to generate a signal periodically or when it is convenient. The overall impact on the total memory bandwidth will be miniscule because the rejuvenation rate is infrequent relative to the bandwidth of the memory. For example, if it is determined that 100K cycles/year is required to mitigate imprint and there are 16K rows per device, then the rejuvenate period is approximately 20 ms. If the cycle time of the memory is 200 ns, then the loss in total bandwidth is one in 100K cycles or 0.001%.

A device that incorporated a rejuvenate scheme, as described above, would require a counter to determine the next row to be rejuvenated. The preferred implementation would be a non-volatile counter. The counter would be N bits long, where $2^N$ is equal to the number of rows. The counter is described in further detail below.

As referred to above, there are two possible implementations of the method of the present invention. The first is to add rejuvenation at the end of every read access. This approach would only require the user to read every row of memory periodically to obtain the benefit. This would extend the cycle time for every read cycle and therefore reduce performance. The second is to implement a rejuvenation scheme that keeps track of the rows that have been rejuvenated and allows the customer to signal the part to perform a rejuvenation cycle periodically when it is convenient.

A method to initiate the process is required for user controlled rejuvenation. Serial memories could use a special slave ID for the $I^2C$ devices and a special command for the SPI devices. The simplest way to initiate the process in parallel memories is to use a pin. A method to signal the user that the process is complete may also be desirable. This could be done by returning a No Acknowledge after the Slave ID if an access is attempted before the rejuvenation cycle completes for $I^2C$ devices. The ready bit in the status register could be set when the process starts and cleared when it completes in the SPI devices.

Figure 6:
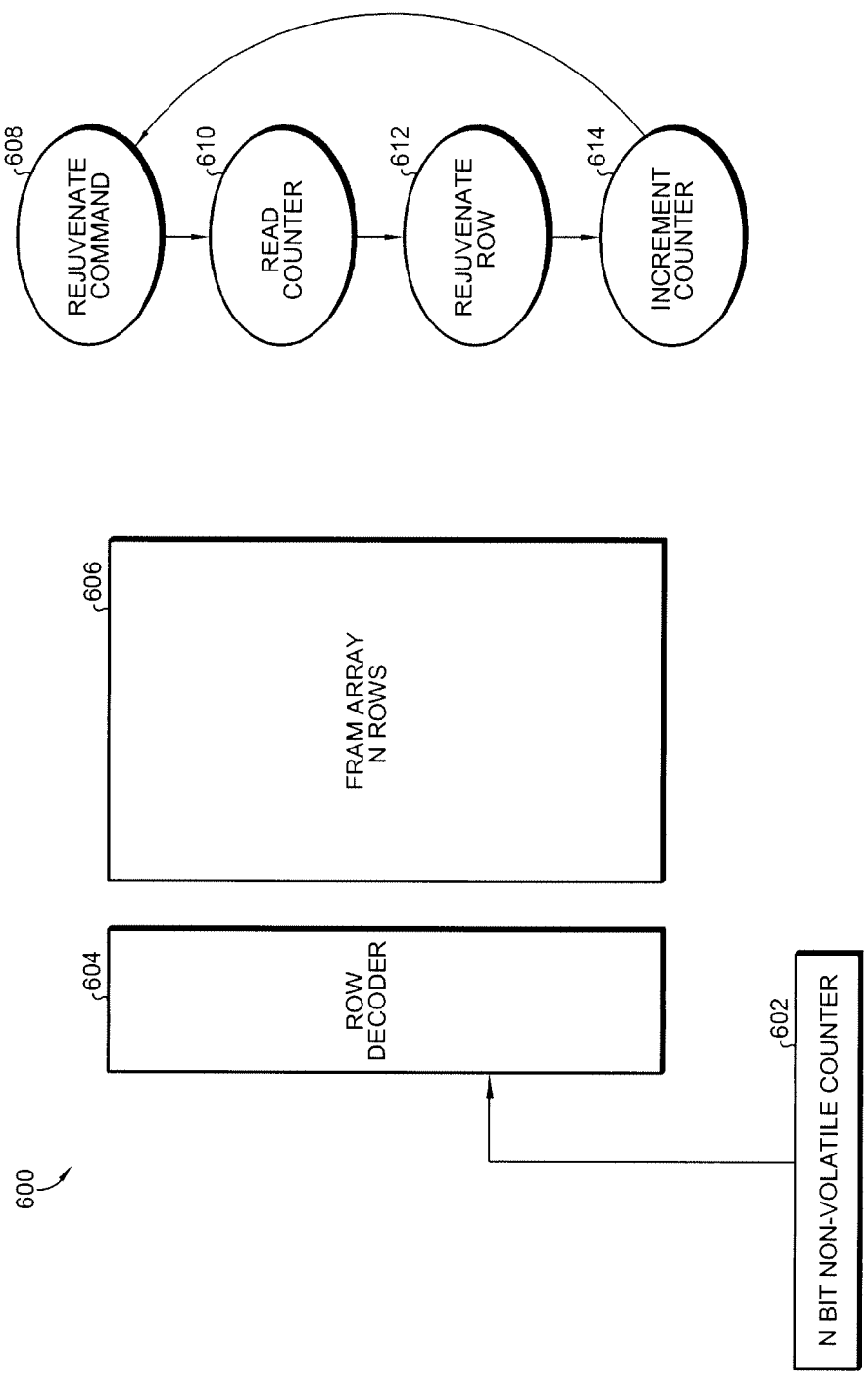
FIG. 6 is a block diagram of a ferroelectric memory and associated flow chart according to the present invention.

Referring now to FIG. 6, a ferroelectric memory 600 is shown including an array of FRAM cells 606 having N rows, a row decoder 604, and a corresponding counter 602. The process of operating memory 600 begins with a rejuvenate signal at step 608. The row to be rejuvenated would be in an N-bit non-volatile counter, wherein N is the number of rows in the memory. At step 610, the counter 602 is read. At step 612, the current row in the memory array 606 is rejuvenated. After the process completes, the counter is incremented at step 614 and the process repeats. When the counter 602 reaches the last row in memory, the counter wraps back to zero and the process is repeated.

Figure 7:
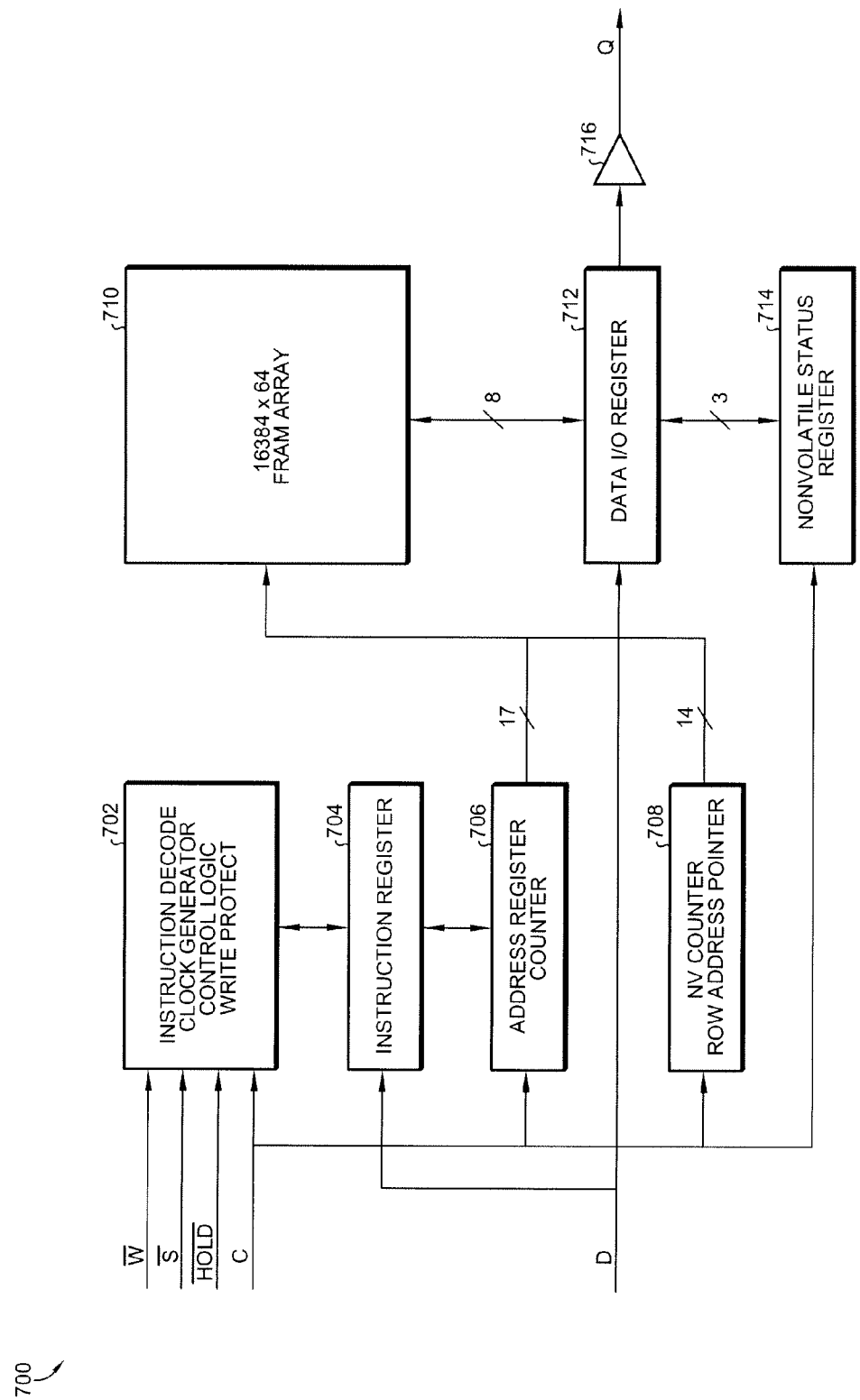
FIG. 7 is a more detailed block diagram of a ferroelectric memory according to the present invention.

A One Megabit SPI ferroelectric memory with rejuvenation is described below with respect to FIGS. 7-10. Referring now to FIG. 7, a 1 Mbit F-RAM with an SPI interface 700 has 16,384 rows with 64 bits per row in array 710. The rejuvenation technique of the present invention can be added by incorporating a 14 bit NV counter 708, some additional bit lines and plate control, and some additional logic to access the status register. The blocks shown in FIG. 7 include a decode block 702, instruction register 704, address register counter 706, NV counter 708, NV memory array 710, data I/O register 712, NV status register 714, and output buffer 716. A standard SPI interface, as a minimum, has a device select (/S), a Clock (C), a data input (D), and a data output (Q). Data is clocked in and out synchronously with the clock. The user operates the part by clocking in Op codes (shown in FIG. 8). Only valid Op codes (commands) can cause an operation. Invalid Op codes are ignored.

The rejuvenation process is initiated with a special command. It is only necessary that the op-code be unique. An example command table is shown in FIG. 8. The rejuvenation command is shown in FIG. 8 as the REJUW command having an example op-code of 0001 0111b.

Each time the rejuvenate command is issued one row is accessed and the ferroelectric capacitors are switched and restored at least one time. The non-volatile counter is the row address pointer. The counter is incremented at the end of the process and rolls over after the most significant row address. This allows the user to periodically issue commands at his convenience and ensures that the process continues successively through the memory.

A feature that may be desirable is to have a means to notify the user when the rejuvenate command completes. The status register can be used by changing bit 0 to a Ready bit. The Ready bit is read only. The user then can poll the Status Register to see if the process has completed. An example Status Register is shown in FIG. 9.

Figure 10:
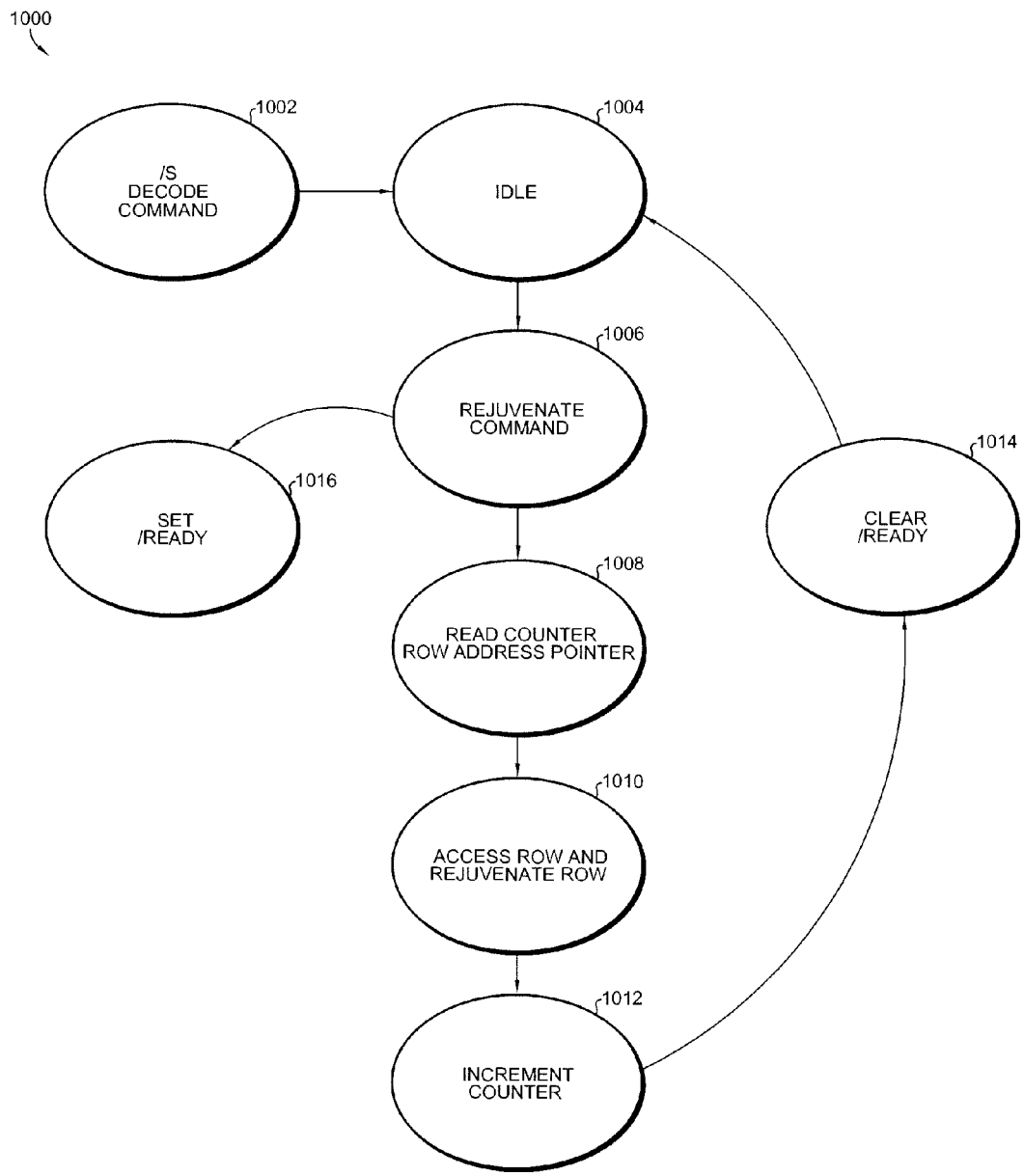
FIG. 10 is a flow chart associated with the operation of the ferroelectric memory of FIG. 7 according to the present invention.

The flow chart 1000 shown in FIG. 10 describes the internal process of the present invention with an SPI protocol as an example. At step 1002 the device is selected and a rejuvenate command is decoded. The Idle process is interrupted at step 1004 and the rejuvenate sequence begins at step 1006. At step 1016 the Ready bit in the status register is set. The non-volatile row address counter is read (pointer to row to be rejuvenated) at step 1008. The row (64 bits in this example) is subjected to the rejuvenate process at step 1010. The counter is then incremented (pointer to the next row to be rejuvenated) at step 1012. The Ready flag is cleared at step 1014. The device then returns to the Idle state at step 1004.

While there have been described above the principles of the present invention in conjunction with specific implementations of a ferroelectric memory in accordance with the present invention, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A method for mitigating imprint in an array of ferroelectric memory cells including a plurality of word lines, plate lines, and bit lines, each bit line connected with a sense amplifier through an isolation device, the method comprising: storing original polarization states from a group of memory cells in respective sense amplifiers; disconnecting the bit lines from the sense amplifiers by turning off the isolation devices; switching the group of memory cells in the array from the original polarization states to first polarization states; switching the group of memory cells in the array from the first polarization states to second polarization states that are opposite to the first polarization states; and connecting the bit lines to the sense amplifiers by turning on the isolation devices to restore the original polarization states stored in the sense amplifiers into the group of memory cells.

2. The method of claim 1 wherein the original polarization states and the restored original polarization states comprise user data.

3. The method of claim 1 wherein the first polarization states of the group of memory cells comprise only ones or only zeroes.

4. The method of claim 1 wherein the second polarization states of the group of memory cells comprise only ones or only zeroes.

5. The method of claim 1 wherein keeping track of the ferroelectric memory cells subjected to the imprint mitigation method comprises the use of a non-volatile counter.

6. A ferroelectric memory array comprising:
a plurality of 1T/1C ferroelectric memory cells each having a bit line node, a plate line node, and a word line node; a plurality of sense amplifiers, each of the sense amplifiers coupled to the bit line node of a respective one of the plurality of memory cells through an isolation device;
and a plurality of bit line isolation devices coupled between the bit line nodes of the memory cells, wherein the plate line nodes of each of the memory cells associated with a single bit line are coupled together.

7. The ferroelectric memory array of claim 6 wherein the word line nodes of the memory cells are coupled together.

\* \* \* \* \*